(12) United States Patent
Ueda et al.

(10) Patent No.: US 7,420,220 B2
(45) Date of Patent: Sep. 2, 2008

(54) SEMICONDUCTOR LIGHT EMITTING DEVICE

(75) Inventors: Mitsunori Ueda, Tokyo (JP); Naoji Nada, Kanagawa (JP); Tetsuyuki Yoshida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/380,564

(22) Filed: Apr. 27, 2006

(65) Prior Publication Data

US 2006/0243996 A1 Nov. 2, 2006

(30) Foreign Application Priority Data

May 2, 2005 (JP) ............................. P2005-134443

(51) Int. Cl.
*H01L 31/0203* (2006.01)
(52) U.S. Cl. .................... 257/98; 257/100; 257/789; 257/795; 257/E23.117
(58) Field of Classification Search ..................... 257/98
See application file for complete search history.

(56) References Cited

U.S. PATENT DOCUMENTS

| 5,618,872 | A | | 4/1997 | Pohl et al. | |
|---|---|---|---|---|---|
| 5,777,433 | A | * | 7/1998 | Lester et al. | 313/512 |
| 6,870,311 | B2 | | 3/2005 | Mueller et al. | |
| 2003/0227249 | A1 | | 12/2003 | Mueller et al. | |
| 2005/0130336 | A1 | * | 6/2005 | Collins, III | 438/26 |
| 2005/0142379 | A1 | * | 6/2005 | Juni et al. | 428/690 |
| 2005/0194896 | A1 | * | 9/2005 | Sugita et al. | 313/506 |
| 2005/0215164 | A1 | | 9/2005 | Mueller et al. | |
| 2005/0253130 | A1 | * | 11/2005 | Tsutsumi et al. | 257/13 |
| 2006/0068154 | A1 | * | 3/2006 | Parce et al. | 428/76 |

FOREIGN PATENT DOCUMENTS

| JP | 7507823 | 8/1995 |
|---|---|---|
| JP | 2004-015063 | 1/2004 |
| WO | 92/25611 | 12/1993 |

\* cited by examiner

*Primary Examiner*—Evan Pert
*Assistant Examiner*—Eduardo A Rodela
(74) *Attorney, Agent, or Firm*—Bell, Boyd & Lloyd LLP

(57) ABSTRACT

A semiconductor light-emitting device having a semiconductor light-emitting chip; a high refractive index lens covering around the semiconductor light-emitting chip; and a resin having fine particles mixed therein that fills a space between the semiconductor light-emitting chip and the lens is provided. In the semiconductor light emitting device, the resin having fine particles mixed therein is composed of an optically transparent resin into which a large number of high refractive fine particles having a mean diameter of 100 nm or less and composed of a dielectric material are mixed uniformly to have a distance 200 nm or less between respective particles.

6 Claims, 3 Drawing Sheets

SEMICONDUCTOR LIGHT EMITTING DEVICE

CROSS REFERENCES TO RELATED APPLICATIONS

The present application claims priority to Japanese Patent Application P2005-134443 filed in the Japanese Patent Office on May 2, 2005, the entire contents of which is being incorporated herein by reference.

BACKGROUND

The present invention relates to a semiconductor light emitting device such as a light emitting diode (LED) or a laser diode (LD).

Recently, a semiconductor light emitting device such as a light emitting diode (LED) or a laser diode (LD) has been employed as a long-life and small-sized light emitting source, and in particular, the LED has drawn attention as a high intensity light source suitable for a backlight light source of a liquid crystal display apparatus.

Heretofore, in a structure for outwardly extracting the light emitted from an LED, it is considered effective for avoiding total internal reflection at an interface between the LED and a portion corresponding to an external lens as high as that of a light emitting portion or a light introducing portion of the LED.

Therefore, it was conceived to form a lens with a glass or a resin having a high refractive index and to cover a chip with the lens.

However, in order to avoid total internal reflection inside the chip, the chip and the lens are only allowed to have a gap smaller than the wavelength. Accordingly, in view of the mechanical tolerance, it is hardly possible to extracting the light using the lens and chip as configured above.

Use of a transparent adhesive having a high refractive index for filling the gap between the lens with a high refractive index and the chip is conceivable. However, such an adhesive having a refractive index n almost reaching 1.7 has extremely high hardness. It has been already found that emission lifetime of the LED is shortened by use of such a hard adhesive causing distortion due to the difference in thermal expansion coefficient between materials. Furthermore, if the resin is peeled off from the chip and/or the lens, optical output significantly drops owing to fully met total internal reflection condition.

Therefore, at present, an LED with low luminous efficiency, in which part of emitted light is taken into the chip and vanishes, is used. Because if a lens with a high refractive index is aimed to reduce total internal reflection of a chip, light extraction effect is difficult to be improved without an adhesive layer having a higher refractive index than that of the lens.

Generally, epoxy resin or silicone resin is often used to seal a cap and a lens. In a case of a power LED which allows current flow therethrough and which emits heat a lot, in particular, it is considered essential to use semisolid one, that is, grease-like or gel-like, such as silicone to seal around the chip.

Here, a structure of a general high-power LED is shown in FIG. 3.

As shown in FIG. 3, a related art high-power LED 100 has a heat sink 120 disposed at the center of a base 110. A semiconductor light-emitting chip 140 is placed and fixed on a sub-mount 130 on the heat sink 120. A silicone resin 150 is filled in a space between the semiconductor light-emitting chip 140 and a plastic lens 160 covering the semiconductor light-emitting chip 140.

The silicone resin 150 has functions of:

(1) dissipating heat generated from the semiconductor light-emitting chip 140 (having a higher heat conductance than air);

(2) relaxing mechanical stress occurred owing to difference in thermal expansion coefficient between materials; and (3) breaking total internal reflection condition (Frustrated TIR condition) occurred on a chip surface by optically keeping in contact with the surface of the semiconductor light-emitting chip 140.

See Japanese Patent Application Publication 2004-15063 and Japanese Translation of PCT International Application Hei 7-0507823, for example.

SUMMARY

However, silicone has excellent property as described above, but has a refractive index of only 1.5 or around. Thus, large part of light emitted from an active layer may vanish without going out from the chip in the related art power LED in which the silicone resin is encapsulated.

In view of the above-described problem, the present invention is made to realize a longer-life semiconductor light-emitting device and improved luminous efficiency thereof.

Other features of the present invention and specific advantages brought by the present invention will be clarified with the description of embodiments.

An embodiment of the present invention is a semiconductor light-emitting device which includes a semiconductor light-emitting chip; a lens having a high refractive index covering around the semiconductor light-emitting chip; and a resin having fine particles mixed therein that fills a space between the semiconductor light-emitting chip and the lens. In the semiconductor light-emitting device, the resin having fine particles mixed therein is composed of an optically transparent resin into which a large number of high refractive fine particles having a mean diameter of 100 nm or less and composed of a dielectric material are mixed uniformly to have a distance 200 nm or less between respective particles.

According to the embodiment of the present invention, a large number of high refractive fine particles having a mean diameter of 100 nm or less and composed of a dielectric material are mixed uniformly to have a distance 200 nm or less between respective particles in an optically transparent resin filled in a space between a semiconductor light-emitting chip and a lens. This enables to make the magnitudes of the refractive indices of the optically transparent resin higher, and to realize a long-life semiconductor light-emitting device and an improved luminous efficiency thereof.

In other words, as compared to the related art LED covered and fixed with an epoxy resin without using silicone, the semiconductor light-emitting device according to the embodiment realizes a longer life as well as increased luminous flux. In addition, even if compared with a related art LED employing silicone so as to have a longer life, in the LED according to the embodiment of the present invention optical output is increased so that high efficiency is obtained, and thus, energy saving is achieved by decreasing drive power, in a case of equal luminous flux, and a longer life is accomplished.

Additional features and advantages are described herein, and will be apparent from the following Detailed Description and the figures.

DETAILED DESCRIPTION

Now, embodiments of the present invention will be described with reference to the attached drawings.

It is to be understood that the present invention is by no means limited to the following description, and allows any proper modifications without departing from the spirit of the invention.

Figure 1:
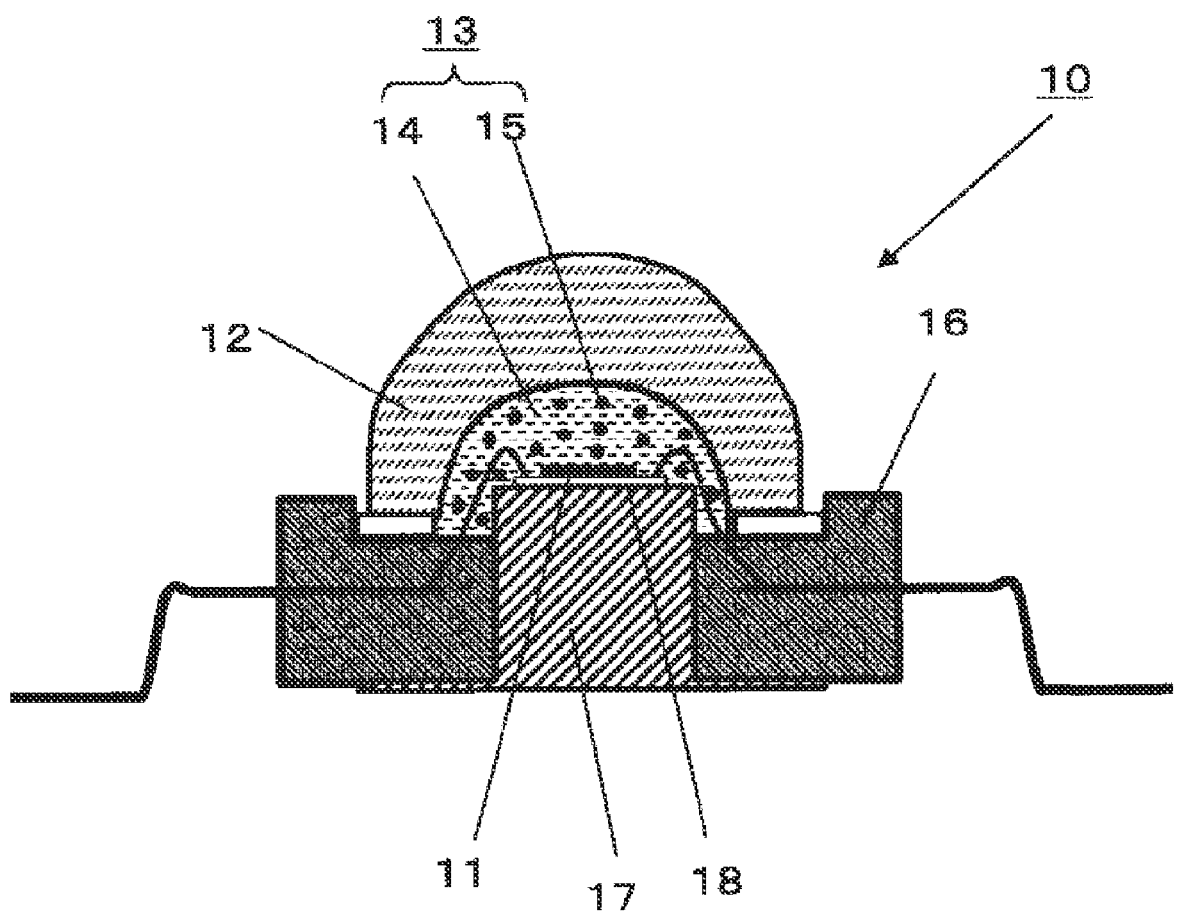
FIG. 1 is a cross-sectional view of a main portion showing a configurational example of a high-power LED according to an embodiment of the present invention.

The present invention is, for example, applied to a high-power LED 10 having a structure as shown in FIG. 1.

The high-power LED 10 is configured with a resin having fine particles mixed therein (hereinafter, referred to "fine particle mixture resin") 13 filled in a space between a semiconductor light-emitting chip 11 and a lens with high refractive index (hereinafter, referred to "high refractive index lens") 12 covering around the semiconductor light-emitting chip 11.

The fine particle mixture resin 13 is obtained by uniformly mixing a large number of fine particles 15 composed of a dielectric material, with a high refractive index, having a mean diameter of 100 nm or less into an optically transparent resin 14 to have a distance of 200 nm or less between respective particles. The fine particle mixture resin 13 is composed of the semisolid, that is, grease-like or gel-like, optically transparent resin 14 in which the dielectric fine particles 15 having a high refractive index are mixed in a ratio of the fine particles to the resin of 0.5:1 to 4:1 in weight %, and functions as a medium apparently having an high refractive index.

The semiconductor light-emitting chip 11 in the high-power LED 10 is placed and fixed on a sub mount 18 on a heat sink 17 provided at a center of a base 16.

The lens 12 is composed of plastic or glass.

The optically transparent resin 14 is composed of a UV curable resin or a two-component curable resin.

The fine particles 15 mixed into the optically transparent resin 14 are mainly composed of a material selected from oxides including titanium oxide, niobium oxide, tantalum oxide, zirconium oxide, cerium oxide and a mixture thereof. In addition, the fine particles 15 may be mainly composed of a material selected from nitrides including aluminum nitride, gallium nitride, silicon nitride and a mixture thereof.

It is desirable that, upon mixing, the fine particles 15 is adjusted to an amount resulting in the reacted fine particle mixture resin 13 having an approximate refractive index as high as, or higher than, the refractive index of the lens 12. Although the value of the refractive index varies depending on a design of the lens 12 and is difficult to set to a value, the higher, the better.

However, if the fine particle mixture resin 13 absorbs light a lot, even if the refractive index is high, the resin absorbs the light extracted by breaking the total internal reflection condition by itself so that the object of extracting the light a lot is hardly achieved. It is noted that even if the fine particle mixture resin 13 is clouded due to light scattering caused by the particles, much light can be extracted as far as the light is not absorbed.

Here, a specific method of generating a gel of a high refractive index.

It is conceived appropriate that the fine inorganic particles 15 to be mixed are formed by the ultra-fine particle synthesis using high temperature flame or the sol-gel method. Here, the synthesized primary fine particles are kept dispersed in a solvent without aggregating.

It is necessary to perform surface treatment on nano particles so that the particles are dispersed without aggregation.

In specific, it is important to lower the aggregating energy of the fine particles by appropriately selecting a surfactant to increase affinity for the solvent. If the fine particles are small enough to have a diameter of several tens of nm and do not aggregate, the mixture solution is so transparent that the opposite side of a wide-mouth bottle of 300 cc, for example, can be seen when the solution is in the bottle, although some coloring is recognized owing to the optical property of the particles. However, once the fine particles aggregate, the solution becomes a clouded suspension so that brightness of the other side of the bottle can be barely determined but the other side of the bottle is not visible due to scattering.

Next, the resultant mixture solution is mixed into silicone oil.

Practically, it is necessary to coat a surface of nano particles with a surfactant having a high affinity for silicone oil, thus, the nano particles are mixed into the silicone while evaporating the solvent.

The silicone herein is any one of a polymer of polydimethylsiloxane, polysiloxane, polyphenylmethylsiloxane and polydimethyldiphenylsiloxane, and a copolymer thereof and a mixture thereof. Polysiloxane is suitable for this application because of its transparency to visible light and thermal stability.

In the high-power LED 10 as configured above, the fine particle mixture resin 13 filled in the space between the semiconductor light-emitting chip 11 and the lens 12 is composed of the optically transparent resin 14 into which a large number of the fine particles 15 composed of dielectric material, having a mean particle diameter of 100 nm or less, are uniformly mixed to have a distance of 200 nm or less between respective particles. The thus-obtained fine particle mixture resin 13 functions as a medium apparently having a high refractive index. Accordingly, the high-power LED 10 is allowed to have improved luminance efficiency and a longer lifetime.

In the above-described embodiment, the present invention is applied to the high-power LED 10 having a single semiconductor light-emitting chip 11. However, the present invention is not limited only to the above high-power LED 10, but may be applied also to a high-power LED 20 having a plurality of semiconductor light-emitting chips 22, as shown in FIG. 2.

Figure 2:
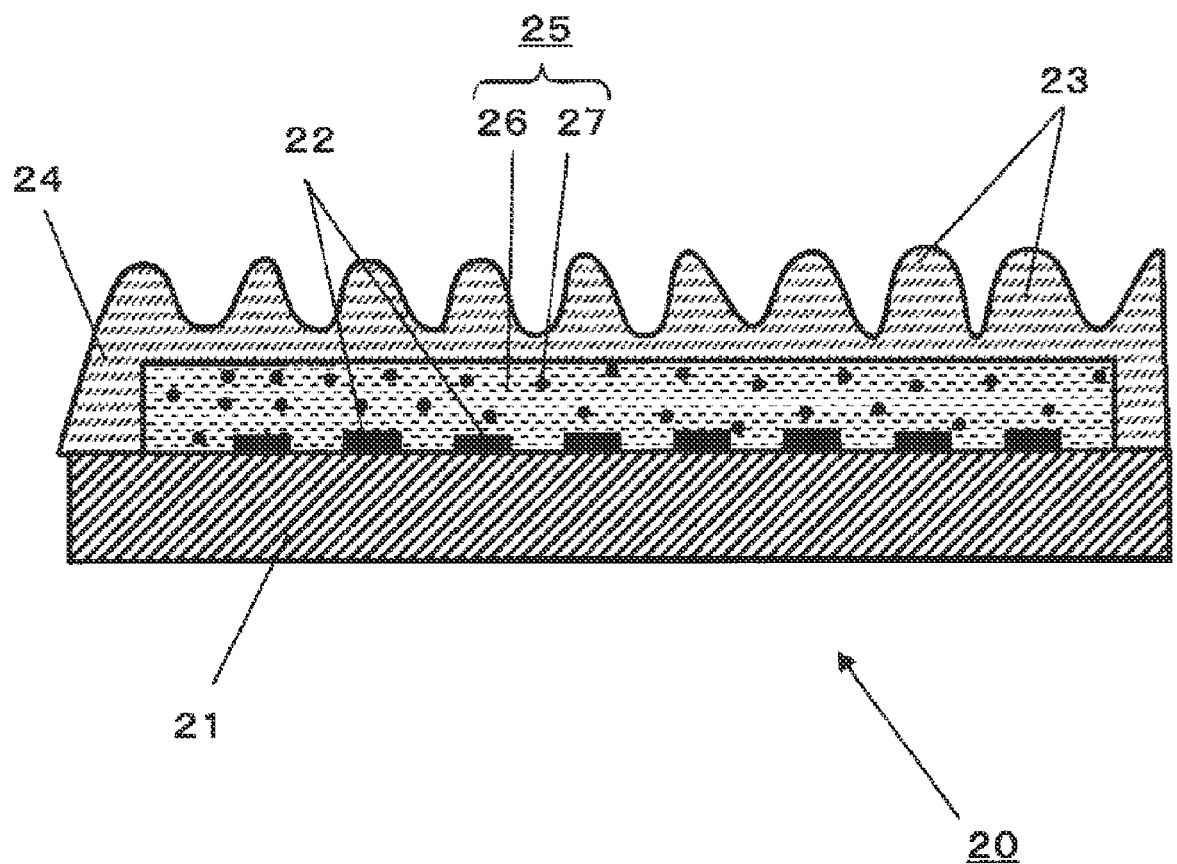
FIG. 2 is a cross-sectional view of a main portion showing another configurational example of a high-power LED according to an embodiment of the present invention.
Figure 3:
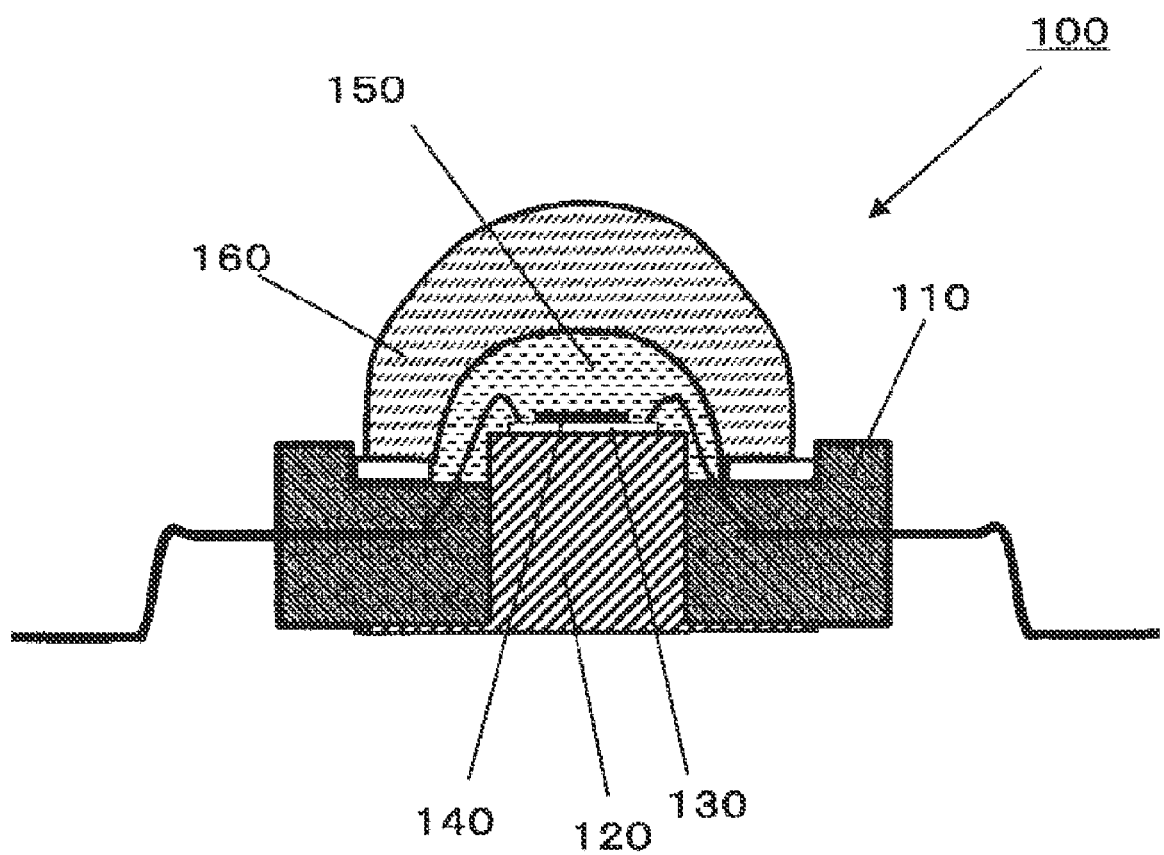
FIG. 3 is a cross-sectional view of a main portion showing a configurational example of a related art high-power LED.

The high-power LED 20 shown in FIG. 2 is configured with a plurality of semiconductor light-emitting chips 22 disposed on a base 21 functioning also as a heat sink, a cap 24 configured with a micro-lens 23 having a high refractive index provided to correspond to the plurality of semiconductor light-emitting chips 22, and fine particle mixture resin 25 filled in a space between the cap 24 and the chips 22.

The fine particle mixture resin 25 is obtained by uniformly mixing a large number of fine particles 27 composed of a dielectric material, with a high refractive index, having a mean diameter of 100 nm or less into the optically transparent resin 26 to have a distance of 200 nm or less between respective particles, and the resin 25 functions as a medium having an apparent high refractive index.

Such a configuration contributes to a longer lifetime and improved luminous efficiency of the high-power LED 20.

In the case of FIG. 2, if the fine particle mixture resin 25 has a hardness of some extent and the LED 20 is not in external contact, the cap 24 may be formed with the fine particle mixture resin 25, that is, the cap 24 and the fine particle mixture resin 25 may be configured integrally to be a single member.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor light-emitting device, comprising:
   a semiconductor light-emitting chip;
   a high refractive index lens covering around the semiconductor light-emitting chip; and
   a resin having fine particles mixed therein that fills a space between the semiconductor light-emitting chip and the lens,
   wherein the resin having fine particles mixed therein consists essentially of an optically transparent resin into which a large number of high refractive fine particles having a mean diameter of 100 nm or less and composed of a dielectric material are mixed uniformly to have a distance 200 nm or less between respective particles, and wherein the fine particles are coated with a surfactant.

2. The semiconductor light-emitting device as claimed in claim 1, wherein:
   the optically transparent resin is any one of a UV curable resin and a two-component curable resin.

3. The semiconductor light-emitting device as claimed in claim 1, wherein:
   the optically transparent resin is a semisolid resin.

4. The semiconductor light-emitting device as claimed in claim 1, wherein:
   the fine particles mixed into the optically transparent resin are mainly composed of a material selected from oxides including titanium oxide, niobium oxide, tantalum oxide, zirconium oxide, cerium oxide and a mixture thereof.

5. The semiconductor light-emitting device as claimed in claim 1, wherein:
   the fine particles mixed into the optically transparent resin are mainly composed of a material selected from nitrides including aluminum nitride, gallium nitride, silicon nitride and a mixture thereof.

6. The semiconductor light-emitting device as claimed in claim 1, wherein the resin and fine particle mixture is transparent.

* * * * *